United States Patent [19]

Pancholy et al.

[11] 4,302,278

[45] Nov. 24, 1981

[54] GaAs CRYSTAL SURFACE PASSIVATION METHOD

[75] Inventors: Ranjeet K. Pancholy, Irvine; René Drouet, Placentia, both of Calif.

[73] Assignee: Rockwell International Corporation, El Segundo, Calif.

[21] Appl. No.: 159,465

[22] Filed: Jun. 16, 1980

[51] Int. Cl.$^3$ .................... C30B 33/00; H01L 21/203; H01L 21/316
[52] U.S. Cl. ................................. 156/610; 156/613; 156/DIG. 70; 156/DIG. 73; 427/82
[58] Field of Search .............. 156/610, 613, DIG. 70, 156/DIG. 73, DIG. 89; 427/82; 148/174, 175

[56] References Cited

U.S. PATENT DOCUMENTS

| | | | |
|---|---|---|---|
| 3,969,164 | 7/1976 | Cho et al. | 156/610 |
| 4,154,873 | 5/1979 | Hickox et al. | 427/82 |
| 4,172,906 | 10/1979 | Pancholy | 427/82 |

OTHER PUBLICATIONS

J. Electrochem. Soc.: Solid State Science and Technology v. 125, No. 4, 4/74, pp. 579–581.

*Primary Examiner*—Gregory N. Clements
*Attorney, Agent, or Firm*—H. Fredrick Hamann; Wilfred G. Caldwell

[57] ABSTRACT

Reheating the cooled wafer product of the known method of forming thermal oxide surface passivation layers on GaAs crystal wafers, i.e. heating the wafer in contact with thermally vaporized $As_2O_3$ in a substantially oxygen free closed vessel at a reaction temperature in excess of 450 degrees, from a temperature lower than the reaction temperature to a temperature higher than the reaction temperature and in the presence of free oxygen increases the compositional, physical and electrical uniformity of the surface layer.

13 Claims, No Drawings

GaAs CRYSTAL SURFACE PASSIVATION METHOD

The invention herein described was made in the course of or under a contract or subcontract thereunder, (or grant) with the Department of the Air Force.

BACKGROUND OF THE INVENTION

1. Field of the Invention

This invention relates to improved surface passivation layers on GaAs crystal wafers, and more particularly to a post oxidation step which increases the compositional, physical and electrical uniformity of native surface passivation layers formed on GaAs crystal wafers by the $As_2O_3$ vapor technique.

The generation of a doping impervious layer on the surface of a GaAs crystal wafer is a key to the advantageous use of these crystals in integrated circuit devices, in order that diffusion may be precisely controlled.

After a number of efforts to imitate the oxide masking technique used in silicon devices in GaAs devices, Takagi et al in *J. Electrochem. Soc.:* SOLID STATE SCIENCE AND TECHNOLOGY, Vol. 125, No. 4, April 1974, at pages 579-581, revealed that the use of a controlled vapor pressure of $As_2O_3$ enabled growth of native oxide films on GaAs crystal wafers.

2. Description of the Prior Art

The above-mentioned Takagi et al article is the best prior art known to applicants. In the method there outlined, GaAs wafers and $As_2O_3$ powder are heated in a closed evacuated quartz ampoule (pressure ca. $10^{-6}$ Torr.). In the presence of $As_2O_3$ vapor generated by heating the ampoule at temperatures in excess of 450°, a thermal oxide is grown on the GaAs. The ampoule is cooled and water quenched. The oxides formed by the Takagi et al technique were not found to be reliably suitable for device application, in that disuniform surface layers were encountered, marked by variations in grain size, bubbles, localized concentrations, and other compositional and physical variations which were readily visible upon magnification. Electrical properties were noted to vary irregularly, too, in keeping with the nonuniform nature of the surface layer.

SUMMARY OF THE INVENTION

It is a major object of the invention to provide an improved method for forming native surface passivation dielectric coating layer on GaAs crystal wafers. It is particularly an object to provide method of forming such layers of increased uniformity in properties. It is a specific object to improve the method of Takagi et al, by the addition of a further step which has been found to reliably provide compositionally, physically, and electrically uniform surface passivation layers on GaAs crystal wafers beyond that realized using the Takagi technique alone.

These and other objects of the invention to become apparent hereinafter, are realized in the method of forming thermal oxide surface passivation layers on GaAs crystal wafers, which comprises heating the wafer in contact with thermally vaporized $As_2O_3$ in a substantially oxygen free closed vessel at a reaction temperature in excess of 450 degrees Centigrade and for a time sufficient to surface react said $As_2O_3$ with said wafer to form a passivation layer thereon of a first level of compositional and electrical uniformity, and thereafter cooling by virtue of the improvement increasing layer compositional and electrical uniformity to a second, higher level, which comprises reheating the cooled wafer from a temperature lower than the reaction temperature to a temperature higher than the reaction temperature and in the presence of free oxygen. Typically, the reheating step is effected under flowing oxygen ambient and at a temperature of not less than 500 degrees Centigrade. Also, the cooling between heating and reheating is preferably to room temperature. The heating and cooling of the crystal is desirably effected within an ampoule defining the closed vessel. In preferred embodiments, the powdered $As_2O_3$ is vaporized within the vessel during heating, and the reheating step effected under substantially one atmosphere ambient pressure.

In a particularly preferred method, the reheating step is effected under flowing oxygen ambient, the heating step is effected at about 470 degrees Centigrade, the reheating step is effected at a temperature of not less than 500 degrees Centigrade, and the cooling step between heating and reheating steps is to substantially room temperature, or about 25° C., with water quenching, both heating and cooling of the crystal is effected within an ampoule evacuated to about $10^{-6}$ Torr. defining the closed vessel, and with a surface passivation sufficient amount of powdered $As_2O_3$ being vaporized within the vessel during heating.

DESCRIPTION OF THE PREFERRED EMBODIMENT

In carrying out the present method, the GaAs crystal wafer and sufficient separate $As_2O_3$ powder to supply adequate amounts of arsenic trioxide in the grown film to ensure the compositional and physical, including electrical, properties necessary for device applications, cf. the Takagi reference above, is placed in a quartz ampoule, and the method steps effected, as appears more particularly from the following example.

EXAMPLE

The ampoule loaded with the GaAs wafer and the $As_2O_3$ powder is evacuated to $10^{-6}$ Torr. and heated in a furnace to a temperature between 450° and 500° C., and preferably to about 470° C., with the temperature being maintained uniform over the heating period which approximates the time necessary to achieve thermal equilibrium between the wafer and the powder. The ampoule is in any event heated for a period sufficient to effect the formation of a native surface passivation film layer on the crystal, e.g. one minute. The ampoule is removed, cooled and finally water quenched. The layer at this point is insufficiently uniform compositionally, physically, and electrically to be suited to critical device applications as manifested by surface irregularities such as localized concentrations on the surface, irregular and unduly large graininess, and disuniform oxide formation. These maleffects are overcome by not stopping the layer formation process at this point, but continuing. Thus, the cooled ampoule is opened, and the wafer subjected to a second oxidation and heating step. As noted, the reheating is to at least 500° C. Additionally, free oxygen is flowed over the wafer in the open ampoule at atmospheric pressure. The result is a rendering uniform of the surface compositional, physical, and electrical properties as is manifested by a highly uniform distribution of like size small granules over the crystal surface.

What is claimed is:

1. A method of temporarily protecting a GaAs crystal wafer, which comprises heating the wafer in contact with thermally vaporized $As_2O_3$ in a substantially oxygen free closed vessel at a reaction temperature in excess of 450 degrees Centigrade and for a time sufficient to surface react said $As_2O_3$ with said wafer to form a passivation layer thereon of a first level of compositional and electrical uniformity; cooling said wafer below said reaction temperature; reheating the cooled wafer from a temperature lower than said reaction temperature to a temperature higher than said reaction temperature and in the presence of free oxygen, to improve layer compositional and electrical uniformity to a second higher level; and heating said wafer to a temperature sufficient to remove said thermal oxide surface passivation layer.

2. The method according to claim 1, in which said reheating step is effected under flowing oxygen ambient.

3. The method according to claim 1, in which said reheating step is effected at a temperature of not less than 500 degrees Centigrade.

4. The method according to claim 1, in which said cooling between heating and reheating is to room temperature.

5. The method according to claim 1, in which heating and cooling of said crystal is effected within an ampoule defining said closed vessel.

6. The method according to claim 1, in which powdered $As_2O_3$ is vaporized within said vessel during heating.

7. The method according to claim 1, in which said reheating step is effected under substantially one atmosphere ambient pressure.

8. The method according to claim 7, in which said reheating step is effected under flowing oxygen ambient.

9. The method according to claim 8, in which said reheating step is effected at a temperature of not less than 500 degrees Centigrade.

10. The method according to claim 9, in which said heating step is to about 470 degrees Centigrade and said cooling step between heating and reheating steps is to substantially room temperature.

11. The method according to claim 10, in which heating and cooling of said crystal is effected within an ampoule evacuated to about $10^{-6}$ Torr. defining said closed vessel.

12. The method according to claim 11, in which a surface passivation sufficient amount of powdered $As_2O_3$ is vaporized within said vessel during heating.

13. The method according to claim 11, in which said ampoule is water quenched to cool said crystal to temperature.

* * * * *